United States Patent
Boardman et al.

(10) Patent No.: US 6,479,219 B2
(45) Date of Patent: Nov. 12, 2002

(54) POLYMERS HAVING SILICON-CONTAINING ACETAL OR KETAL FUNCTIONAL GROUPS

(75) Inventors: Larry D. Boardman, Woodbury, MN (US); Carl R. Kessel, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/035,900

(22) Filed: Dec. 26, 2001

(65) Prior Publication Data

US 2002/0055065 A1 May 9, 2002

Related U.S. Application Data

(62) Division of application No. 09/351,882, filed on Jul. 13, 1999, now Pat. No. 6,359,078.
(60) Provisional application No. 60/097,008, filed on Aug. 18, 1998.

(51) Int. Cl.[7] .............................................. G03F 7/039
(52) U.S. Cl. ..................... 430/326; 430/270.1; 430/905
(58) Field of Search ........................... 430/326, 270.1, 430/905

(56) References Cited

U.S. PATENT DOCUMENTS

| | | | |
|---|---|---|---|
| 3,666,473 A | 5/1972 | Colom et al. | 430/192 |
| 4,115,128 A | 9/1978 | Kita | 430/191 |
| 4,173,470 A | 11/1979 | Fahrenholtz et al. | 430/5 |
| 4,865,945 A | 9/1989 | Noguchi et al. | 430/192 |
| 5,264,319 A | 11/1993 | Sugiyama et al. | 430/192 |
| 5,318,877 A | 6/1994 | Ober et al. | 430/270.1 |
| 5,338,818 A | 8/1994 | Brunsvold et al. | 528/48 |
| 5,422,223 A | 6/1995 | Sachdev et al. | 430/190 |
| 5,457,003 A | 10/1995 | Tanaka et al. | 430/176 |
| 5,712,078 A | 1/1998 | Huang et al. | 430/270.1 |
| 5,849,808 A | 12/1998 | Schacht et al. | 522/31 |
| 5,962,180 A | 10/1999 | Iwanaga et al. | 430/170 |
| 5,998,557 A | 12/1999 | Choi | 526/279 |
| 6,013,411 A | 1/2000 | Aoai et al. | 430/270.1 |
| 6,037,097 A | 3/2000 | Bucchignano et al. | 430/270.1 |
| 6,051,362 A | 4/2000 | Choi et al. | 430/270.1 |
| 6,071,670 A * | 6/2000 | Ushirogouchi et al. | 430/270.1 |
| 6,280,897 B1 * | 8/2001 | Asakawa et al. | 430/270.1 |

FOREIGN PATENT DOCUMENTS

| | | |
|---|---|---|
| EP | 0 236 261 A2 | 9/1987 |
| EP | 0 552 548 A1 | 7/1993 |

OTHER PUBLICATIONS

C.G. Willson in *Introduction to Microlithography* (American Chemical Society, 1994, pp. 212–231).

B.J. Lin and T.H.P. Chang, *J. Vac. Sci. Tech.* 1979, 16, p. 1669–1671.

B.J. Lin, *Solid State Technol.*, 1983, 26 (5), p. 105–112.

T. Ueno in *Microlithography Science and Technology*, Marcel Decker, pp. 429–464 (1998).

*Fast, Cheap, and Cutting–Edge*, Business Week/Mar. 16, 1998, p. 113.

* cited by examiner

*Primary Examiner*—John S. Chu
(74) *Attorney, Agent, or Firm*—Scott A. Bardell

(57) ABSTRACT

The polymers of the present invention are characterized by having at least one pendent acetal or ketal functional group in which at least two substituents of the acetal/ketal carbon atom independently comprise at least one silicon atom. The compositions of the present invention are useful as positive working resist compositions, in particular as the top imaging layer in a bilayer resist scheme for use in the manufacture of integrated circuits.

1 Claim, 1 Drawing Sheet

POLYMERS HAVING SILICON-CONTAINING ACETAL OR KETAL FUNCTIONAL GROUPS

CROSS REFERENCE TO RELATED APPLICATION

This divisional application claims priority from U.S. application Ser. No. 09/351,882, filed Jul. 13, 1999, now allowed, which claims the benefit of U.S. Provisional Application No. 60/097,008, filed Aug. 18, 1998.

BACKGROUND OF THE INVENTION

The present invention relates to resist materials for use in lithography, for example, in the production of integrated circuits and particularly to polymers having acetal or ketal functional groups containing silicon.

It is well known in the art to produce positive photoresist formulations such as those described in U.S. Pat. Nos. 3,666,473; 4,115,128; and 4,173,470. These include alkali-soluble phenol-formaldehyde novolac resins together with light-sensitive materials, usually a substituted diazonaphthoquinone compound. The resins and sensitizers are dissolved in an organic solvent or mixture of solvents and are applied as a thin film or coating to a substrate suitable for the particular application desired.

The resin component of these photoresist formulations is soluble in aqueous alkaline solutions, but the naphthoquinone compound acts as a dissolution rate inhibitor with respect to the resin. Upon exposure of selected areas of the coated substrate to actinic radiation, however, the naphthoquinone compound undergoes a radiation induced structural transformation, and the exposed areas of the coating are rendered more soluble than the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate.

An alternative method for forming the pattern in a resist is referred to as chemical amplification. This method is described by C. G. Willson in *Introduction to Microlithography* (American Chemical Society, 1994, pp. 212–231). In this method, a photoacid generator is added to a polymer containing acid-labile groups. When a coating of this mixture is exposed to actinic radiation in an imagewise fashion, the photoacid generator in those areas struck by light will produce acid, and this acid causes a reaction of the acid-labile groups in the polymer. The polymer that has reacted in this manner is rendered soluble in aqueous base, and the image can be developed in the same manner as described above. Chemically amplified resist systems typically require a much lower dose of actinic radiation to effectively develop the pattern than do the novolac/diazoquinone type resist systems.

In most instances, the exposed and developed photoresist on the substrate will be subjected to treatment by a substrate-etchant solution or gas. The photoresist coating protects the coated areas of the substrate from the etchant, and thus the etchant is only able to etch the uncoated areas of the substrate, which in the case of a positive photoresist, correspond to the areas that were exposed to actinic radiation. Thus, an etched pattern can be created on the substrate which corresponds to the pattern on the mask, stencil, template, etc., that was used to create selective exposure patterns on the coated substrate prior to development.

The relief pattern of the photoresist on the substrate produced by the method described above is useful for various applications including as an exposure mask or a pattern such as is employed in the manufacture of miniaturized integrated electronic components.

The properties of a photoresist composition which are important in commercial practice include the photospeed of the resist, development contrast, resist resolution, and resist adhesion.

Resist resolution refers to the capacity of a resist system to reproduce the smallest features from the mask to the resist image on the substrate.

In many industrial applications, particularly in the manufacture of miniaturized electronic components, a photoresist is required to provide a high degree of resolution for very small features (on the order of two microns or less).

The ability of a resist to reproduce very small dimensions, on the order of a micron or less, is extremely important in the production of large-scale integrated circuits on silicon chips and similar components. Circuit density on such a chip can only be increased, assuming photolithography techniques are utilized, by increasing the resolution capabilities of the resist.

Photoresists are generally categorized as being either positive working or negative working. In a negative working resist composition, the imagewise light-struck areas harden and form the image areas of the resist after removal of the unexposed areas with a developer. In a positive working resist composition, the exposed areas are the non-image areas. The light-struck parts are rendered soluble in aqueous alkali developers. While negative resists are the most widely used for industrial production of printed circuit boards, positive resists are capable of much finer resolution and smaller imaging geometries. Hence, positive resists are the choice for the manufacture of densely packed integrated circuits.

In the normal manner of using a positive photoresist, a single layer of this material is imaged to give a mask on the substrate, which can further be etched with a suitable etchant or used for deposition of materials, such as metals. However, due to the limitations of optical imaging systems, resolution of small patterns, on the order of 2 microns or less, is limited, particularly if topography is present on the substrate. It was discovered by B. J. Lin and T. H. P. Chang, *J. Vac. Sci. Tech.* 1979, 16, p. 1669, that this resolution can be further improved by using multilevel systems to form a portable conformable mask.

In a conventional two-layer resist system (B. J. Lin, *Solid State Technol.*, 1983, 26 (5), p. 105), the substrate is first coated with a relatively thick planarizing layer to level any topography that might be present on the substrate. A relatively thin imaging layer resist is next coated on top of the planarizing layer. A latent image is deposited in the imaging layer by irradiation of this layer through a mask, and the desired pattern is formed in the imaging layer by subsequent development using conventional means. Pattern transfer to the substrate from the imaging layer through the underlying planarizing layer is finally accomplished by an anisotropic oxygen plasma etch ($O_2$RIE). Hence much importance is given to the resistance of the imaging layer resist to $O_2$RIE. Generally, those materials that form oxides upon $O_2$RIE, for example those containing >10% by weight silicon, are considered to have high resistance to $O_2$RIE.

SUMMARY OF THE INVENTION

The polymers of the present invention are characterized by having at least one pendent acetal or ketal functional group in which at least two substituents of the acetal/ketal carbon atom independently comprise at least one silicon atom. The compositions of the present invention are useful as positive working resist compositions, in particular as the top imaging layer in a bilayer resist scheme for use in the manufacture of integrated circuits. The incorporation of at least two silicon atoms in each monomeric unit enables the formation of a robust etch mask upon exposure to an oxygen plasma used in reactive ion etching processes.

In one aspect, the present invention provides a polymer comprising a polymeric backbone having at least one pendent acetal/ketal functional group having an acetal/ketal carbon atom in which at least two substituents attached to the acetal/ketal carbon atom independently comprise at least one silicon atom.

In another aspect, the present invention provides a resist material comprising compounds having the formula:

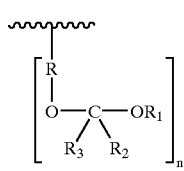

(I)

wherein

R is a divalent connecting group or a covalent bond;

$R_1$ is alkyl, aryl, aralkyl, or silyl;

$R_2$ is a hydrogen atom, alkyl, aryl, aralkyl, or silyl;

$R_3$ is alkyl, aryl, aralkyl, or silyl;

or any two of $R_1$, $R_2$, or $R_3$ may be combined to form a cyclic group, with the proviso that at least two of $R_1$, $R_2$, or $R_3$ comprise at least one silicon atom and wherein n is an integer greater than or equal to 1.

In another aspect, the present invention provides a method of forming resist patterns comprising the steps of:

a) providing a polymer comprising a polymeric backbone having at least one pendent acetal/ketal functional group having an acetal/ketal carbon atom in which at least two substituents attached to the acetal/ketal carbon atom independently comprise at least one silicon atom;

b) providing a substrate having an organic polymer base layer;

c) coating the silicon-containing polymer onto the organic polymer base layer of the substrate to form a top layer;

d) exposing the coated substrate to actinic radiation sufficient to form a latent image; and e) developing the latent image.

In this application, "an acetal/ketal functional group" is represented by the formula: —O—C(OR$_1$)(R$_2$)(R$_3$); an "acetal/ketal carbon atom" is a carbon atom that is bound to both oxygen atoms in the acetal/ketal functional group; the acetal/ketal carbon atom is an acetal carbon atom if $R_2$ is a hydrogen atom; if each of $R_2$ and $R_3$ is an alkyl or an aryl group, the carbon atom is a ketal carbon atom; and a "substituent" is any group or covalent bond represented by R, $R_1$, $R_2$, and $R_3$. It is to be understood that the terms "alkyl", "aryl", and "aralkyl groups" and the like include such groups that are substituted with other groups including but not limited to —Si— or —Si—O— containing groups.

DETAILED DESCRIPTION OF THE PREFERRED EMBODIMENTS

Figure 1:
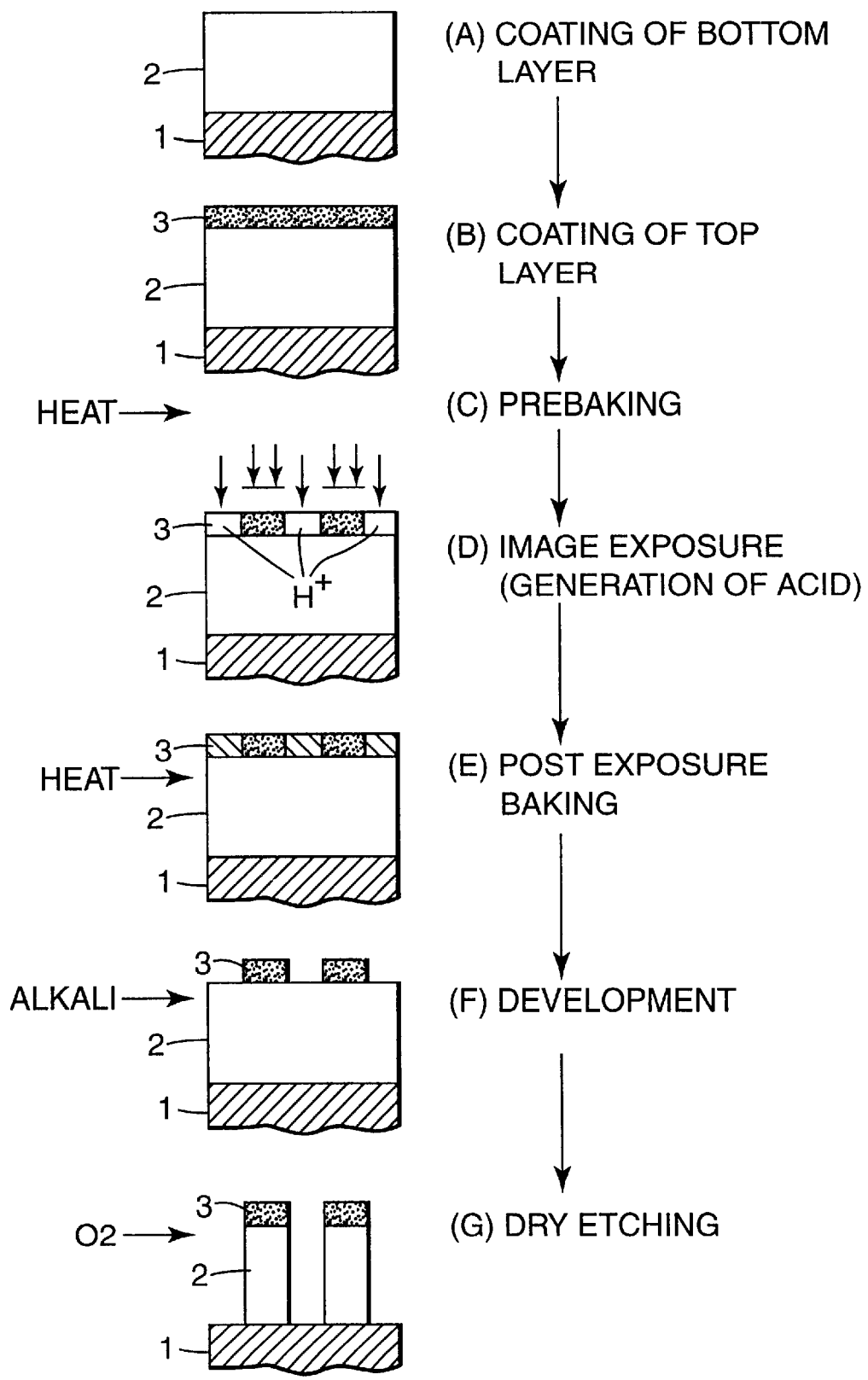
FIG. 1 shows cross-sectional views illustrating a process of forming resist patterns according to the present invention.

The backbone of the polymers of the invention may be any polymeric chain of monomers capable of being developed provided that the backbone chemistry allows for the polymers of the invention, that is, polymers with a least one of the above-described pendent groups having an acetal/ketal carbon atom in which at least two substituents attached to the acetal/ketal carbon atom independently comprise at least one silicon atom.

Suitable backbones for the polymers of the invention include homopolymers and copolymers comprising monomers such as vinylphenols, (meth)acrylic acids, alkyl (meth) acrylates, maleic anhydrides, vinylbenzoic acids, alkyl vinylbenzoates, and alpha-olefins such as ethylene, propylene, and the like.

Preferred homo- and co-polymers for use as backbones of the polymers of the invention include poly(4-vinylphenol), poly(vinylbenzoic acid), methyl methacrylate-co-methacrylic acid, and methacrylic acid-co-4-vinylphenol.

Useful divalent connecting groups represented by R include branched or unbranched and/or substituted or unsubstituted groups including —CH$_2$—$_n$ wherein n is an integer from 1 to 18, arylene, arylenecarbonyl, carbonyl, cyclohexylene, aralkylene, and the like. Preferred R substituents are arylene, arylenecarbonyl, and carbonyl.

Useful substituents represented by $R_1$ include branched or unbranched and substituted or unsubstituted groups including alkyl, preferably C$_1$–C$_8$, aryl, aralkyl, silyl, trialkylsilyl, pentaalkyldisilyl, and the like. Any of the $R_1$ substituents may contain at least one silicon atom. Preferred $R_1$ substituents are trialkylsilyl and pentaalkyldisilyl. More preferred $R_1$ substituents are trimethylsilyl, tert-butyldimethylsilyl, and pentamethyldisilyl.

Useful substituents represented by $R_2$ include hydrogen and branched or unbranched and substituted or unsubstituted groups including alkyl, preferably C$_1$–C$_8$, aryl, aralkyl, silyl, trialkylsilyl, pentaalkyldisilyl, (trialkylsiloxy)silyl, and the like. Any of the $R_2$ substituents may contain at least one silicon atom. Preferred $R_2$ substituents are hydrogen and alkyl. More preferred $R_2$ substituents are hydrogen, methyl, 3-(trimethylsilyl)propyl, 3,3,3-tris(trimethylsilyl)propyl, tris(trimethylsilyl)silylethyl, and tris(trimethylsilyloxy)silylethyl.

Useful substituents represented by $R_3$ include branched or unbranched and substituted or unsubstituted groups including alkyl, preferably C$_1$–C$_8$, aryl, aralkyl, silyl, trialkylsilyl, pentaalkyldisilyl, and the like. Any of the $R_3$ substituents may contain at least one silicon atom. A preferred $R_3$ substituent is alkyl. More preferred $R_3$ substituents are 3-(trimethylsilyl)propyl, 3,3,3-tris(trimethylsilyl)propyl, tris(trimethylsilyl)silylethyl, and tris(trimethylsilyloxy)silylethyl.

Additionally, any two of $R_1$, $R_2$, and $R_3$ may be combined to form a cyclic group containing, in addition to carbon atoms, oxygen, silicon, and/or sulfur. An example of such a group is the tetrahydropyran-2-yl group.

A preferred polymer of the invention is represented by the following formula:

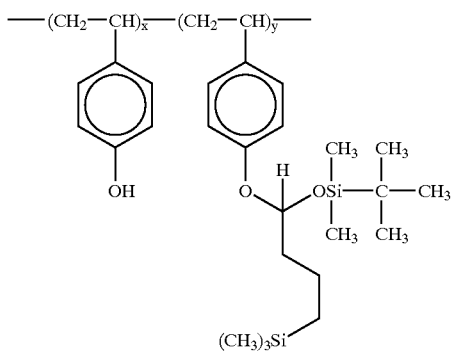

(II)

wherein preferably the sum of x+y is a number, preferably, an integer ranging from about 5 to about 1000, x is a number, preferably, an integer ranging from 0 to about 950 and y is number, preferably, an integer ranging from 1 to about 1000.

Another preferred polymer of the invention is represented by the following formula:

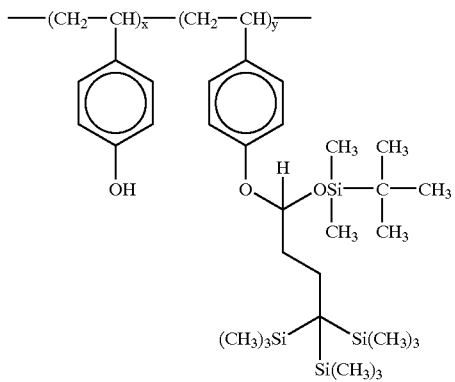

wherein preferably the sum of x+y is a number, preferably, an integer ranging from about 5 to about 1000, x is a number, preferably, an integer ranging from 0 to about 950 and y is a number, preferably, an integer ranging from 1 to about 1000.

Useful acid generators of the invention are compounds or compositions, which produce acid on exposure to actinic radiation. Examples of useful acid generators include those described by T. Ueno in *Microlithography Science and Technology*, Marcel Decker, pp. 429–464 (1998), incorporated herein by reference. Preferred acid generators are onium salts such as diaryliodonium salts and triarylsulfonium salts as described in *Microlithography Science and Technology*, cited above. More preferred acid generators are diaryl iodonium salts such as tolylcumyliodonium tetrakis (pentafluorophenyl)borate, diphenyliodonium trifluoromethanesulfonate, bis(4-tolyl)iodonium trifluoromethanesulfonate, and bis(4-tolyl)iodonium perfluorobutanesulfonate.

The silicon-containing acetal polymers of the invention are generally made by the addition of a phenolic or carboxylic acid group to a silicon-containing enolether.

FIG. 1 shows cross-sectional views illustrating the process of forming resist patterns according to the present invention. First, a thin film of an organic polymer 2 (any suitable and etchable organic polymer film used in the art) is applied to a substrate 1 such as a silicon wafer (primed or unprimed) (step A: coating of a base polymer layer). A thin film of the resist composition of the invention 3 is applied to the organic polymer film 2 completing a two-layer structure on the substrate (step B: coating of a top layer). The coated substrate is optionally prebaked (step C: prebaking), the top layer is subsequently masked, and the two layered structure is irradiated through the mask so to release acid from the acid generator contained in the resist composition (step D: imagewise exposure). The coated and exposed wafer is optionally heated to speed the acid-catalyzed cleavage of the acetal or ketal functionalized groups of the polymer of the invention (step E: post exposure baking (also referred to as PEB)). As a result, the masked portion of the resist remains insoluble in an aqueous alkali solution. Thereafter, the exposed resist material in the unmasked region is removed with an alkali developer (step F: development). The patterned two layered structure is then dry-etched using, for example, an oxygen plasma such that the lower organic polymer film 2 is removed from those areas from which the top layer resist composition of the invention has been removed (step G: dry etching), thus forming a resist pattern. Suitable organic polymers for the base organic layer include any organic polymer material that can be etched with oxygen plasma. The radiation used to form the image in the resist can be of any wavelength that results in release of acid from the acid generator.

EXAMPLES

Preparation of 2,2,3,3,9,9-hexamethyl-4-oxa-3,9-disiladec-5-ene

A dried reaction flask equipped for magnetic stirring was flushed with nitrogen and charged with a 1 F solution of (trimethylsilylmethyl)magnesium chloride in diethyl ether (300 ml, 300 mmol). Diethyl ether was distilled under reduced pressure. The resulting neat Grignard reagent was dissolved in 500 mL of dry tetrahydrofuran, the solution was cooled to −78 ° C., and copper(I) bromide-dimethyl sulfide complex (2.16 grams, 10.5 mmol, available from Aldrich Chemical Company, Inc., Milwaukee, Wis.) and hexamethylphosphoramide (100 grams, 560 mmol, available from Aldrich Chemical Company, Inc.) were added to the reactor with stirring. Acrolein (14.1 mL, 11.8 grams, 210 mmol, available from Aldrich Chemical Company, Inc.) dissolved in a 1 M solution of tert-butyldimethylsilyl chloride (300 mL, 300 mmol, available from Aldrich Chemical Company, Inc.) in tetrahydrofuran was added dropwise to the cooled reaction mixture, with stirring, over a period of 3 hours. After an additional 2 hours reaction time, triethylamine (42.0 mL, 30.5 grams, 300 mmol, available from Aldrich Chemical Company, Inc.) was added, and the reaction mixture was subsequently allowed to warm to room temperature. The reaction mixture was diluted with pentane (1 L), water (50 mL) was added, and the mixture was transferred to a separatory funnel. The organic phase was separated from the aqueous phase and washed with water (ten× 50-mL portions) to remove hexamethylphosphoramide. The combined aqueous washes were extracted once with pentane (100 mL), and the combined organic phases were washed once with a saturated aqueous sodium chloride solution (100 mL) and dried over magnesium sulfate. The mixture was filtered, and the filtrate was concentrated in a rotary evaporator under reduced pressure. Vacuum distillation of the residue afforded 2,2,3,3,9,9-hexamethyl-4-oxa-3,9-disiladec-5-ene as a clear, colorless liquid (49.6 grams, 91 percent). The $^1$H, $^{13}$C, and $^{29}$Si NMR spectra of the product were consistent with a 10:1 mixture of the E and Z stereoisomers of 2,2,3,3,9,9-hexamethyl-4-oxa-3,9-disiladec-5-ene.

Preparation of (E)-8,8-bis(trimethylsilyl)-2,2,3,3,9,9-hexamethyl-4-oxa-3,9-disiladec-5-ene A dried reaction flask equipped for magnetic stirring was flushed with nitrogen and charged with tris(trimethylsilyl)

methane (23.3 grams, 100 mmol, available from Aldrich Chemical Company, Inc.) and dry tetrahydrofuran (200 mL). A 1.4 F solution of methyllithium in diethyl ether (86 mL, 120 mmol, available from Aldrich Chemical Company, Inc.) was added, and the reaction mixture was stirred at room temperature for 20 hours. The solution was cooled to −78° C., and copper(I) bromide-dimethyl sulfide complex (0.72 gram, 3.5 mmol) and hexamethylphosphoramide (30 grams, 170 mmol) were added to the cooled reaction mixture with stirring. Acrolein (5.3 mL, 4.9 grams, 80 mmole) dissolved in a 1 M solution of tert-butyldimethylsilyl chloride in tetrahydrofuran (100 mL, 100 mmol, available from Aldrich Chemical Company, Inc.), was added to the reaction mixture dropwise, with stirring, over a period of 1 hour. After an additional 2 hours reaction time, triethylamine (14.0 mL, 10.1 grams, 100 mmol) was added, and the reaction mixture was subsequently allowed to warm to room temperature. The reaction mixture was diluted with pentane (300 mL), water (50 mL) was added, and the mixture was transferred to a separatory funnel. The organic phase was separated from the aqueous phase and washed with water (ten×50-mL portions) to remove hexamethylphosphoramide. The combined aqueous washes were extracted once with pentane (100 mL), and the combined organic phases were washed once with a saturated aqueous sodium chloride solution (100 mL) and dried over magnesium sulfate. The mixture was filtered, and the filtrate was concentrated in a rotary evaporator under reduced pressure. Vacuum distillation of the residue afforded (E)-8,8-bis(trimethylsilyl)-2,2,3,3,9,9-hexamethyl-4-oxa-3,9-disiladec-5-ene as a clear, colorless liquid (24.2 grams, 75 percent). The $^1$H, $^{13}$C, and $^{29}$Si NMR spectra of the product were consistent with the structure of (E)-8,8-bis(trimethylsilyl)-2,2,3,3,9,9-hexamethyl-4-oxa-3,9-disiladec-5-ene.

Example 1

Preparation of a Copolymer of Formula II

A dried reaction flask equipped for magnetic stirring was flushed with nitrogen and charged with 2,2,3,3,9,9-hexamethyl-4-oxa-3,9-disiladec-5-ene (10.34 grams, 40 mmol, prepared as described above), poly(4-vinylphenol) (4.81 grams, 40 mmol, $M_n$=1500, $M_w$=4000, available from Polysciences Inc., Warrington, Pa.), dichloromethane (70 mL), and tetrahydrofuran (30 mL). p-Toluenesulfonic acid monohydrate (0.15 grams, 0.8 mmol, available from J. T. Baker, Philipsburg, N.J.) was added, and the reaction mixture was stirred at room temperature for 24 hours. Potassium carbonate (11 grams, 80 mmol, available from J. T. Baker) was added, and the reaction mixture was stirred at room temperature for an additional 12 hours. The mixture was filtered, and the filtrate was concentrated under reduced pressure. Methanol (50 mL) was added to the concentrate, and the resultant mixture was stirred vigorously for several minutes. The insoluble phase was separated and washed with methanol (two×20-mL portions). Removal of residual solvent under reduced pressure afforded 4.36 grams of a light yellow solid. Concentration of the methanol extract and similar treatment of the concentrate provided a second crop of 0.93 gram. The $^1$H NMR spectrum of the combined product was consistent with a copolymer in which 60–65 percent of the phenolic groups were protected as the corresponding mixed acetal ($M_n$=4000, $M_w$=8500).

Example 2

Preparation of a Copolymer of Formula II

A dried reaction flask equipped for magnetic stirring was flushed with nitrogen and charged with 2,2,3,3,9,9-hexamethyl-4-oxa-3,9-disiladec-5-ene (10.34 grams, 40 mmol, prepared as described above), poly(4-vinylphenol) (7.21 grams, 60 mmol, $M_n$=2000, $M_w$=20,000, available from Polysciences Inc.), dichloromethane (100 mL), and tetrahydrofuran (50 mL). p-Toluenesulfonic acid monohydrate (0.23 grams, 1.2 mmol) was added, and the reaction mixture was stirred at room temperature for 24 hours. Potassium carbonate (14 grams, 100 mmol) was added, and the reaction mixture was stirred at room temperature for an additional 12 hours. The mixture was filtered, and the filtrate was concentrated under reduced pressure. The concentrate was dissolved in tetrahydrofuran (100 mL), and the resulting solution was added dropwise, with rapid stirring, to water (7 L). The precipitated polymer was collected by filtration, washed with water, and dried under vacuum. The product was slurried with pentane and filtered to yield 5.71 grams of a light yellow solid. The $^1$H NMR spectrum of the solid was consistent for a copolymer in which 30–35 percent of the phenolic groups were protected as the corresponding mixed acetal ($M_n$=3500, $M_w$=35,000).

Example 3

Preparation of a Copolymer of Formula II

A dried reaction flask equipped for magnetic stirring was flushed with nitrogen and charged with (E)-8,8-bis(trimethylsilyl)-2,2,3,3,9,9-hexamethyl-4-oxa-3,9-disiladec-5-ene (10.12 grams, 25 mmol, prepared as described above), poly(4-vinylphenol) (4.51 grams, 38 mmol, $M_n$=2000, $M_w$=20,000), dichloromethane (70 mL), and tetrahydrofuran (35 mL). p-Toluenesulfonic acid monohydrate (0.14 gram, 0.8 mmol) was added, and the reaction mixture was stirred at room temperature for 24 hours. Potassium carbonate (14 grams, 100 mmol) was added, and the reaction mixture was stirred at room temperature for an additional 12 hours. The mixture was filtered, and the filtrate was concentrated under reduced pressure. The concentrate was dissolved in tetrahydrofuran (100 mL), and the resulting solution was added dropwise, with rapid stirring, to water (7 L). The precipitated polymer was collected by filtration, washed with water, and dried under vacuum. The product was slurried with pentane and filtered to yield 5.33 grams of a light yellow solid. The $^1$H NMR spectrum of the product was consistent with a copolymer in which approximately 15 percent of the phenolic groups were protected as the corresponding mixed acetal ($M_n$=3500, $M_w$=35,000).

Example 4

A stock solution was prepared by combining the copolymer of Example 1 (5.26 grams) and propylene glycol methyl ether acetate (21.6 mL). A coating formulation was prepared by combining this solution (3.0 grams) with diphenyliodonium triflate (24 mg, commercially available) and a 0.03 weight percent solution of Dow Corning 5103™ Surfactant (available from Dow Corning Corporation, Midland, Mich.) in ethyl lactate (7.0 grams). The coating formulation was spin coated at 2500 rpm for 60 seconds on a six-inch diameter silicon wafer that had been previously primed with hexamethyldisilazane at 110° C. in a Yield Engineering Systems Model 15 vapor priming oven. The coated wafer was post-apply baked at 85° C. for 60 seconds on a SOLITEC brand hotplate to produce an approximately 1600 angstrom thick coating. The coated wafer prepared in this manner was exposed through a contact mask with a mercury arc lamp (main line at 365 nm) for 35 seconds. The exposed wafer was immersed in 0.21 N aqueous tetramethylammonium hydroxide for 60 seconds and rinsed with water.

Examination of the wafer after development revealed that the coating had been completely removed from the areas that had been exposed to actinic radiation while the unexposed regions of the wafer showed no erosion of the applied coating.

Example 5

A stock solution was prepared by combining the copolymer of Example 2 (5.0 grams), tolylcumyliodonium tetrakis(pentafluorophenyl)borate (0.10 grams, available from Rhone-Poulenc North American Chemicals, Rock Hill, S.C.), and propylene glycol methyl ether acetate (20.4 grams). A coating formulation was prepared by combining this solution (4.5 grams) with additional tolylcumyliodonium tetrakis(pentafluorophenyl)borate (25 mg, available from Rhone-Poulenc North American Chemicals). The coating formulation was spin coated at 5500 rpm for 45 seconds on a six-inch diameter silicon wafer bearing a 5000 angstrom thick coating of poly(4-vinylphenol). The coated wafer was post-apply baked on a SOLITEC hotplate at 100° C. for 60 seconds to obtain an approximately 5000 angstrom thick coating. The coated wafer prepared in this manner was pattern exposed on a 248 nm stepper at exposure doses ranging from 1 to 199 mJ/cm$^2$ in steps of 2 mJ. The exposed wafer was developed with 0.26 N aqueous tetramethylammonium hydroxide for 30 seconds and rinsed with water. Spin coating, post-apply baking, and developing were carried out on an enclosed track system. Examination of the wafer after development revealed 0.475 micron resolved lines and spaces at an exposure dose of 29 mJ/cm$^2$.

Example 6

The copolymer of Example 1 (0.48 grams), tolylcumyliodonium tetrakis(pentafluorophenyl)borate (24 mg, available from Rhone-Poulenc North American Chemicals), and propylene glycol methyl ether acetate (1.93 grams) were combined, and the resultant solution was spin coated at 3000 rpm for 60 seconds on a four-inch diameter unprimed silicon wafer. The coated wafer was post-apply baked in a forced air oven at 130° C. for 5 minutes. A thin sheet of aluminum in which several holes had been cut was placed over the coated wafer covering approximately one half of the wafer surface, and the exposed portion of the coating was irradiated by passing the wafer through a UV processor fitted with a FUSION SYSTEMS H bulb (main line at 365 nm, 100 mJ/cm$^2$ delivered dose). The aluminum sheet was removed and the exposed wafer was immersed in 0.23 N aqueous tetramethylammonium hydroxide for 30 seconds and rinsed with water. Examination of the wafer after development revealed that the coating had been completely removed from the areas that had been exposed to actinic radiation, while the unexposed region of the wafer showed no apparent erosion of the applied coating.

Example 7

The copolymer of Example 3 (0.30 grams), tolylcumyliodonium tetrakis(pentafluorophenyl)borate (60 mg), and propylene glycol methyl ether acetate (1.20 grams) were combined, and the resultant solution was spin coated at 3000 rpm for 60 seconds on a four-inch unprimed silicon wafer. The coated wafer was post-apply baked in a forced air oven at 50° C. for 10 minutes. A thin sheet of aluminum in which several holes had been cut was placed over the coated wafer covering approximately one half of the wafer surface, and the exposed portion of the coating was irradiated by passing the wafer through a UV processor fitted with a FUSION SYSTEMS H bulb (main line at 365 nm, 100 mJ/cm$^2$ delivered dose). The aluminum sheet was removed, and the exposed wafer was immersed in 0.23 N aqueous tetramethylammonium hydroxide for 2 minutes and rinsed with water. Examination of the wafer after development revealed that the coating had been completely removed from the areas that had been exposed to actinic radiation, while the unexposed region of the wafer showed no apparent erosion of the applied coating.

While the invention has been described in terms of several preferred embodiments in which the resist is applied in a bilayer system, those skilled in the art will recognize that the resist may also be utilized in single or multilayer systems and that the invention can be practiced with further modifications within the spirit and scope of the appended claims.

What is claimed is:

1. A method of forming resist patterns comprising the steps of:

a) providing a polymer comprising a polymeric backbone having at least one pendent acetal/ketal functional group having an acetal/ketal carbon atom in which at least two substituents attached to the acetal/ketal carbon atom independently comprise at least one silicon atom;

b) providing a substrate having an organic polymer base layer;

c) coating the silicon-containing polymer onto the organic polymer base layer of the substrate to form a top layer;

d) exposing the coated substrate to actinic radiation sufficient to form a latent image; and e) developing the latent image.

* * * * *

UNITED STATES PATENT AND TRADEMARK OFFICE
CERTIFICATE OF CORRECTION

PATENT NO. : 6,479,219 B2
DATED : November 12, 2002
INVENTOR(S) : Boardman, Larry D.

It is certified that error appears in the above-identified patent and that said Letters Patent is hereby corrected as shown below:

Column 5,
Line 23, insert -- (III) -- below "formula:".

Column 8,
Line 23, delete "Formula II" and insert in place thereof -- Formula III --.
Line 55, delete "Coming" and insert in place thereof -- Corning --.

Signed and Sealed this

Twenty-second Day of March, 2005

JON W. DUDAS
*Director of the United States Patent and Trademark Office*